United States Patent
Chu et al.

(10) Patent No.: US 12,278,184 B2
(45) Date of Patent: Apr. 15, 2025

(54) VERTICALLY-STACKED FIELD EFFECT TRANSISTOR CELL

(71) Applicant: International Business Machines Corporation, Armonk, NY (US)

(72) Inventors: Albert M Chu, Nashua, NH (US); Junli Wang, Slingerlands, NY (US); Albert M. Young, Fishkill, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 17/657,378

(22) Filed: Mar. 31, 2022

(65) Prior Publication Data

US 2023/0317611 A1     Oct. 5, 2023

(51) Int. Cl.
| | | |
|---|---|---|
| H10D 84/03 | (2025.01) | |
| H01L 23/528 | (2006.01) | |
| H10D 84/01 | (2025.01) | |
| H10D 84/85 | (2025.01) | |

(52) U.S. Cl.
CPC ..... *H01L 23/5286* (2013.01); *H10D 84/0186* (2025.01); *H10D 84/0188* (2025.01); *H10D 84/038* (2025.01); *H10D 84/856* (2025.01)

(58) Field of Classification Search
CPC ......... H01L 23/5286; H01L 21/823871; H01L 21/823878; H01L 27/0922; H01L 21/8221; H01L 27/0688; H01L 27/092; H01L 23/535; H10D 84/0186; H10D 84/0188; H10D 84/038; H10D 84/856; H10D 84/85; H10D 88/00; H10D 88/01
See application file for complete search history.

(56) References Cited

U.S. PATENT DOCUMENTS

| | | |
|---|---|---|
| 4,622,569 A | 11/1986 | Lade |
| 6,605,506 B2 | 8/2003 | Wu |
| 7,800,136 B2 | 9/2010 | Shiga |
| 9,026,977 B2 | 5/2015 | Tarabbia |
| 10,784,171 B2 | 9/2020 | Frougier |
| 2020/0075574 A1 | 3/2020 | Smith |
| 2020/0104460 A1 | 4/2020 | Peng |
| 2021/0028068 A1 | 1/2021 | Dentoni Litta |
| 2021/0074350 A1 | 3/2021 | Vincent |

(Continued)

*Primary Examiner* — Karen Kusumakar
*Assistant Examiner* — Adam S Bowen
(74) *Attorney, Agent, or Firm* — L. Jeffrey Kelly

(57) ABSTRACT

Embodiments are disclosed for a system. The system includes multiple tracks. Further, one track includes a power rail for a first voltage. The system also includes a first via, disposed beneath, and in electrical contact with, the power rail. The system additionally includes a first contact, beneath, and in electrical contact with, the first via. The system further includes a first field effect transistor (FET), beneath, and in electrical isolation with, the first contact. Additionally, the system includes a second FET, beneath, and in electrical contact with, the first FET. Further, the system includes a second contact, beneath, and in electrical contact with, the second FET. Also, the system includes a second via, beneath, and in electrical contact with, the second contact. The system additionally includes a buried power rail (BPR), beneath, and in electrical contact with, the second via, wherein the BPR comprises a second voltage.

18 Claims, 13 Drawing Sheets

(56) References Cited

U.S. PATENT DOCUMENTS

| | | | |
|---|---|---|---|
| 2021/0098294 A1* | 4/2021 | Smith | H01L 23/535 |
| 2021/0343715 A1* | 11/2021 | Wu | H01L 27/0688 |
| 2022/0093593 A1* | 3/2022 | Yang | H10D 84/0186 |
| 2022/0223610 A1* | 7/2022 | Chhabra | G11C 8/10 |
| 2022/0336325 A1* | 10/2022 | Lai | H01L 29/42392 |

* cited by examiner

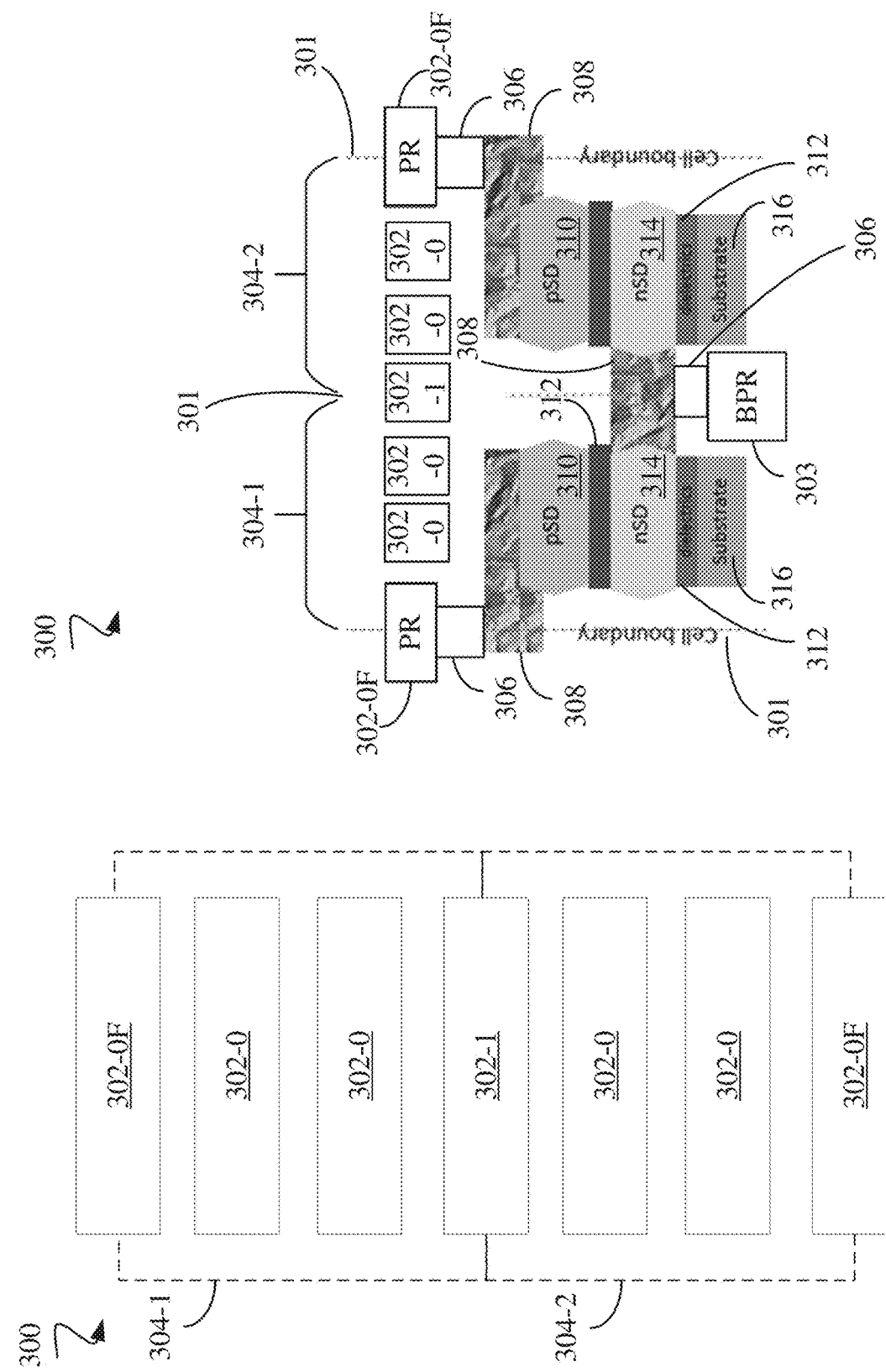

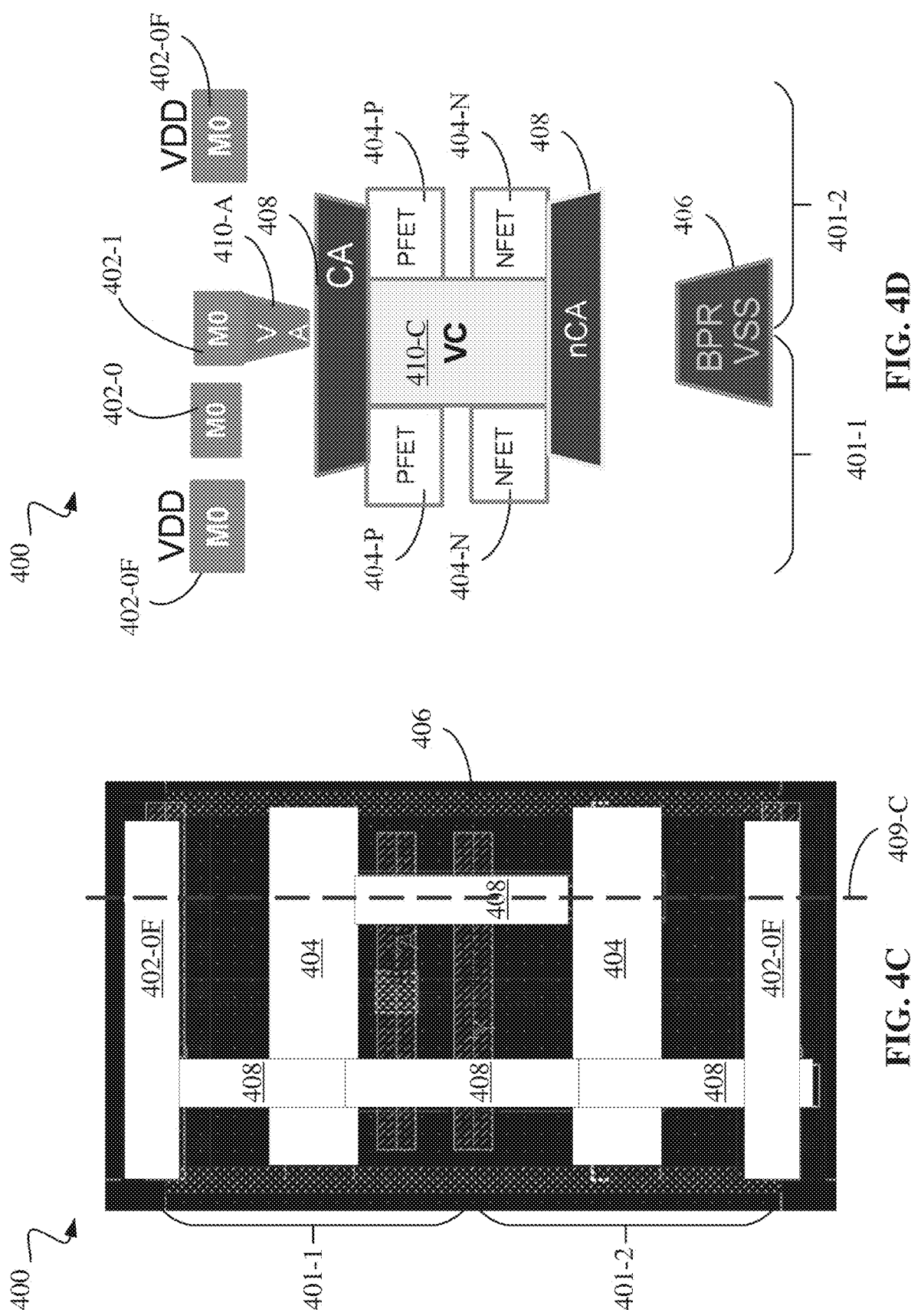

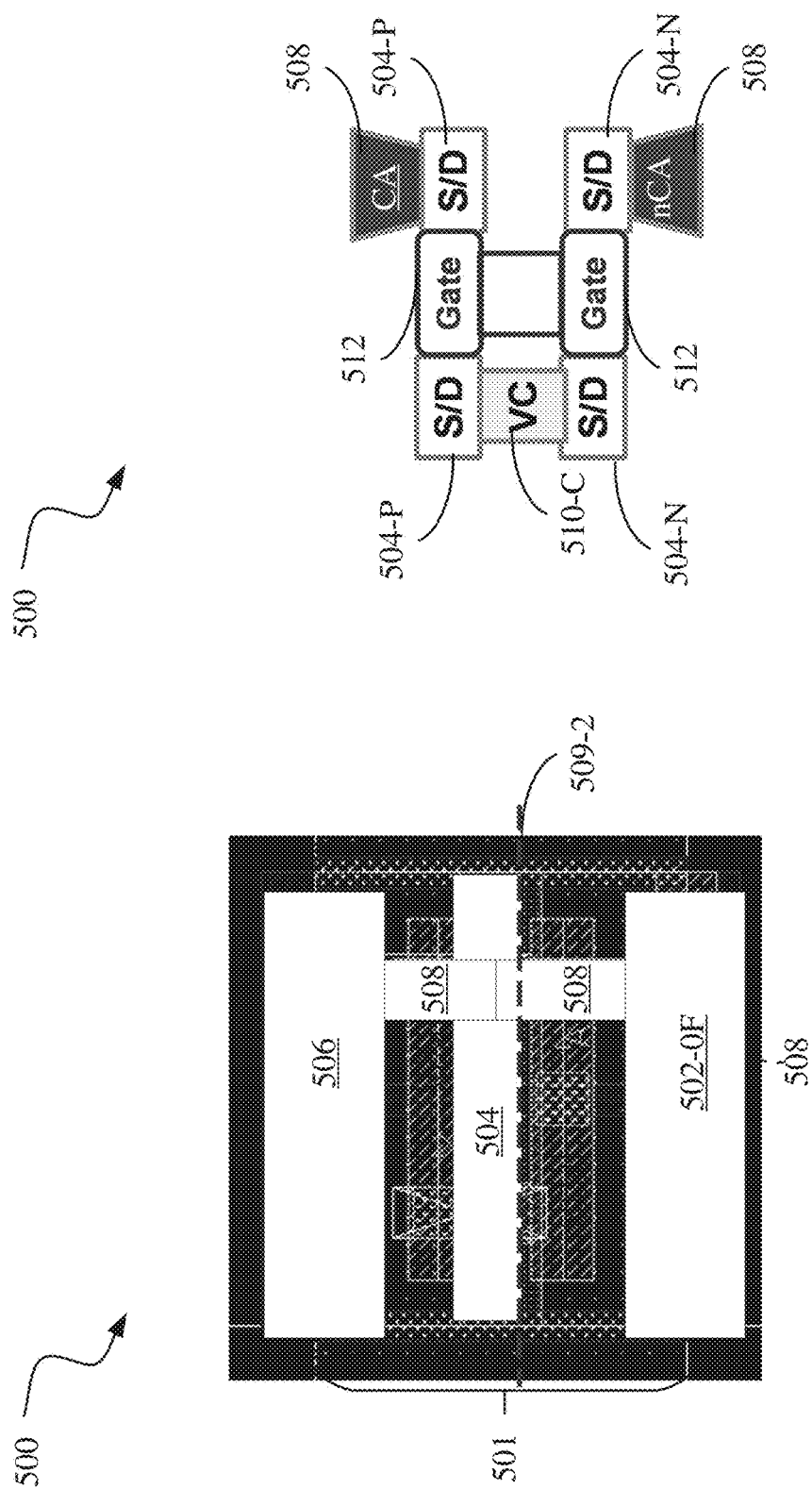

VERTICALLY-STACKED FIELD EFFECT TRANSISTOR CELL

BACKGROUND

The present disclosure relates to a vertically-stacked field effect transistor (FET), and more specifically to a standard cell of a vertically-stacked FET.

A standard cell is a set of structures (e.g., FETs) that can provide functionality such as, storage or Boolean logic in a complementary metal-oxide semiconductor (CMOS) device. A standard cell can include a number of tracks, each of which contribute to the cell height. However, by vertically stacking FETs, it is possible to reduce the number of tracks in each cell, and thus, reduce the cell height. However, reducing the number of tracks can reduce the number of pin hit points, which can make routing the wiring within the standard cell challenging.

SUMMARY

Embodiments are disclosed for a system. The system includes multiple tracks. Further, one track includes a power rail for a first voltage. The system also includes a first via, disposed beneath, and in electrical contact with, the power rail. The system additionally includes a first contact, beneath, and in electrical contact with, the first via. The system further includes a first field effect transistor (FET), beneath, and in electrical contact with, the first contact. Additionally, the system includes a second FET, beneath, and in electrical contact with, the first FET. Further, the system includes a second contact, beneath, and in electrical contact with, the second FET. Also, the system includes a second via, beneath, and in electrical contact with, the second contact. The system additionally includes a buried power rail (BPR), beneath, and in electrical contact with, the second via, wherein the BPR comprises a second voltage.

Additional embodiments are disclosed for a method. The method includes forming an active area of a wafer. The method also includes forming a shallow trench isolation on the wafer. The method further includes completing a front end of line on the wafer. The method additionally includes performing a wafer flip and bond of the wafer. Also, the method includes performing backside thinning of the wafer. Further, the method includes completing a front end of line process for a bottom device of the wafer. Additionally, the method includes forming a backside power rail (BPR) for a voltage source (VSS) of the wafer. The method also includes forming a via in contact with the BPR. The method further includes forming a plurality of oxide layers on the BPR. The method additionally includes performing the wafer flip and bond of the wafer. Also, the method includes completing a metal gate of the wafer. Further, the method includes completing a middle of line (MOL) of the wafer. Additionally, the method includes completing a back end of line (BEOL) of the wafer.

The present summary is not intended to illustrate each aspect of, every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 3A is a block diagram of the top view of an example vertically-stacked FET CMOS device, in accordance with some embodiments of the present disclosure.

FIG. 3B is a block diagram of a cross-section view of an example vertically-stacked FET CMOS device, in accordance with some embodiments of the present disclosure.

FIG. 4C is a block diagram of the top view of an example vertically-stacked FET CMOS device, in accordance with some embodiments of the present disclosure.

FIG. 4D is a block diagram of a cross-section view of an example vertically-stacked FET CMOS device, in accordance with some embodiments of the present disclosure.

FIG. 5C is a block diagram of the top view of an example vertically-stacked FET CMOS device, in accordance with some embodiments of the present disclosure.

FIG. 5D is a block diagram of a cross-section view of an example vertically-stacked FET CMOS device, in accordance with some embodiments of the present disclosure.

Figure 1:
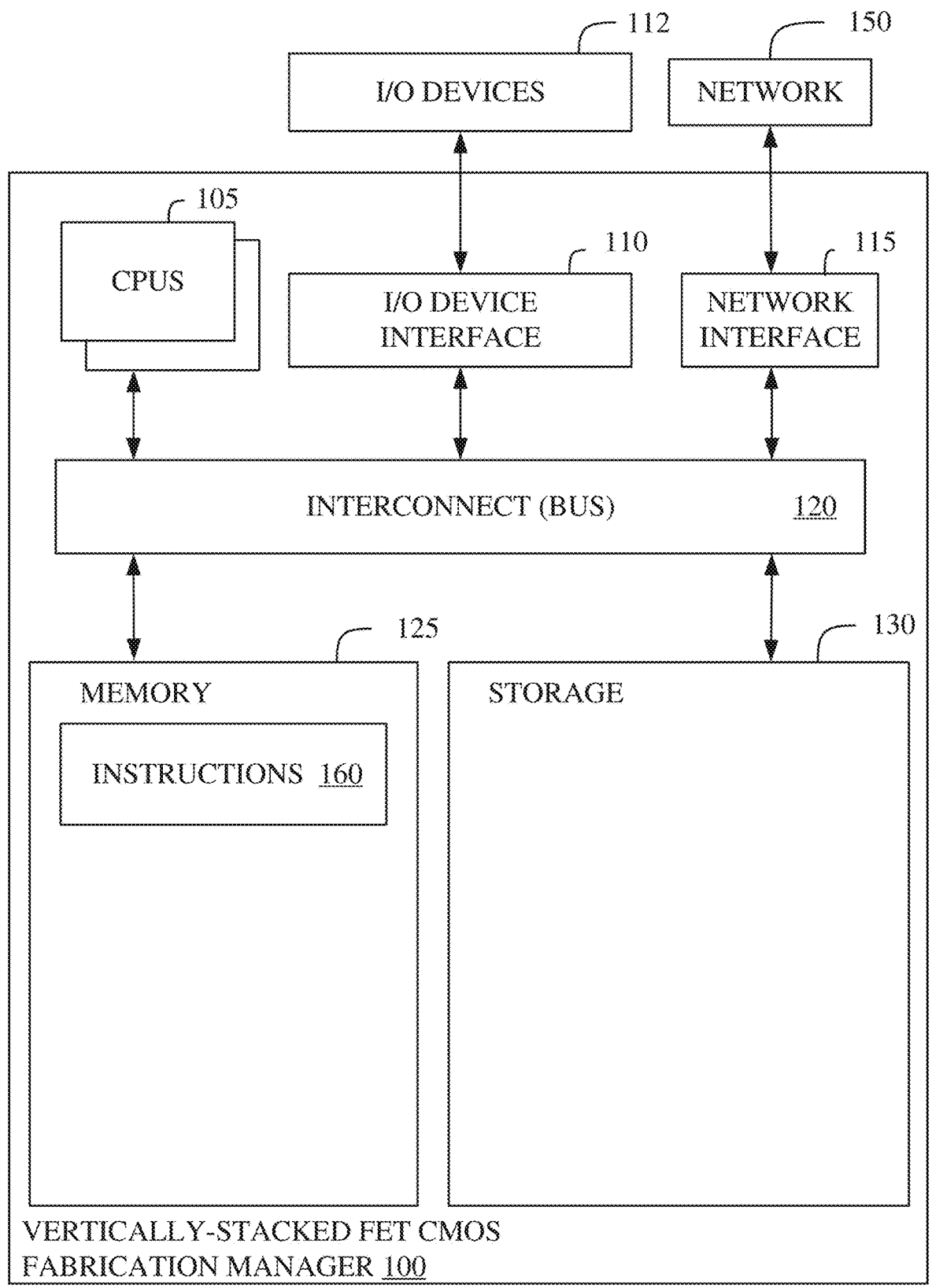
FIG. 1 is a block diagram of an example vertically-stacked field effect transistor (FET) complementary metal oxide semiconductor (CMOS) fabrication manager, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the embodiments described. On the contrary, the intention is to cover all modifications, equivalents, and alternatives falling within the spirit and scope of the present disclosure.

DETAILED DESCRIPTION

As stated previously, by vertically stacking FETs in a standard cell of a CMOS device, it is possible to reduce the number of tracks in each cell, and thus, the cell height. However, reducing the number of tracks can reduce the number of pin hit points, which can make routing the wiring within the standard cell challenging.

Accordingly, some embodiments of the present disclosure can provide a standard cell of vertically-stacked FETs without reducing the number of tracks. Rather, because of the reduced cell height resulting from the vertically-stacked FETs, it is possible to create two rows of cells within the same area as a standard cell that does not include vertical stacking. Further, some embodiments of the present disclosure can bury the supply voltage pin (VSS) beneath a track disposed between the two cells, such that the VSS can supply voltage for both.

FIG. 1 is a block diagram of an example vertically-stacked field effect transistor (FET) complementary metal oxide semiconductor (CMOS) fabrication manager 100, in accordance with some embodiments of the present disclosure. In various embodiments, the example vertically-stacked FET CMOS fabrication manager 100 can perform the method described in FIGS. 12A-12B to design and/or fabricate, in whole or in part, any of the components discussed in FIGS. 2-11. In some embodiments, the example vertically-stacked FET CMOS fabrication manager 100 provides instructions for the aforementioned methods and/or functionalities to a client machine such that the client machine executes the method, or a portion of the method, based on the instructions provided by the example vertically-stacked FET CMOS fabrication manager 100. In some embodiments, the example vertically-stacked FET CMOS fabrication manager 100 comprises software executing on hardware incorporated into a plurality of devices.

The example vertically-stacked FET CMOS fabrication manager 100 includes a memory 125, storage 130, an interconnect (e.g., BUS) 120, one or more CPUs 105 (also referred to as processors 105 herein), an I/O device interface 110, I/O devices 112, and a network interface 115.

Each CPU 105 retrieves and executes programming instructions stored in the memory 125 or the storage 130. The interconnect 120 is used to move data, such as programming instructions, between the CPUs 105, I/O device interface 110, storage 130, network interface 115, and memory 125. The interconnect 120 can be implemented using one or more busses. The CPUs 105 can be a single CPU, multiple CPUs, or a single CPU having multiple processing cores in various embodiments. In some embodiments, a CPU 105 can be a digital signal processor (DSP). In some embodiments, CPU 105 includes one or more 3D integrated circuits (3DICs) (e.g., 3D wafer-level packaging (3DWLP), 3D interposer based integration, 3D stacked integrated circuits (3D-SICs), monolithic 3D integrated circuits, 3D heterogeneous integration, 3D system in package (3DSiP), and/or package on package (PoP) CPU configurations). Memory 125 is generally included to be representative of a random access memory (e.g., static random access memory (SRAM), dynamic random access memory (DRAM), or Flash). The storage 130 is generally included to be representative of a non-volatile memory, such as a hard disk drive, solid state device (SSD), removable memory cards, optical storage, and/or flash memory devices. Additionally, the storage 130 can include storage area-network (SAN) devices, the cloud, or other devices connected to the example vertically-stacked FET CMOS fabrication manager 100 via the I/O device interface 110 or to a network 150 via the network interface 115.

In some embodiments, the memory 125 stores instructions 160. However, in various embodiments, the instructions 160 are stored partially in memory 125 and partially in storage 130, or they are stored entirely in memory 125 or entirely in storage 130, or they are accessed over a network 150 via the network interface 115.

Instructions 160 can be processor-executable instructions for performing any portion of, or all, any of the method described in FIGS. 12A-12B to design and/or fabricate, in whole or in part, any of the components discussed in FIGS. 2-11.

In various embodiments, the I/O devices 112 include an interface capable of presenting information and receiving input. For example, I/O devices 112 can present information to a user interacting with example vertically-stacked FET CMOS fabrication manager 100 and receive input from the user.

The example vertically-stacked FET CMOS fabrication manager 100 is connected to the network 150 via the network interface 115. Network 150 can comprise a physical, wireless, cellular, or different network.

In some embodiments, the example vertically-stacked FET CMOS fabrication manager 100 can be a multi-user mainframe computer system, a single-user system, or a server computer or similar device that has little or no direct user interface but receives requests from other computer systems (clients). Further, in some embodiments, the example vertically-stacked FET CMOS fabrication manager 100 can be implemented as a desktop computer, portable computer, laptop or notebook computer, tablet computer, pocket computer, telephone, smart phone, network switches or routers, or any other appropriate type of electronic device.

It is noted that FIG. 1 is intended to depict the representative major components of an example vertically-stacked FET CMOS fabrication manager 100. In some embodiments, however, individual components can have greater or lesser complexity than as represented in FIG. 1, components other than or in addition to those shown in FIG. 1 can be present, and the number, type, and configuration of such components can vary.

Figures 2A, 2B:
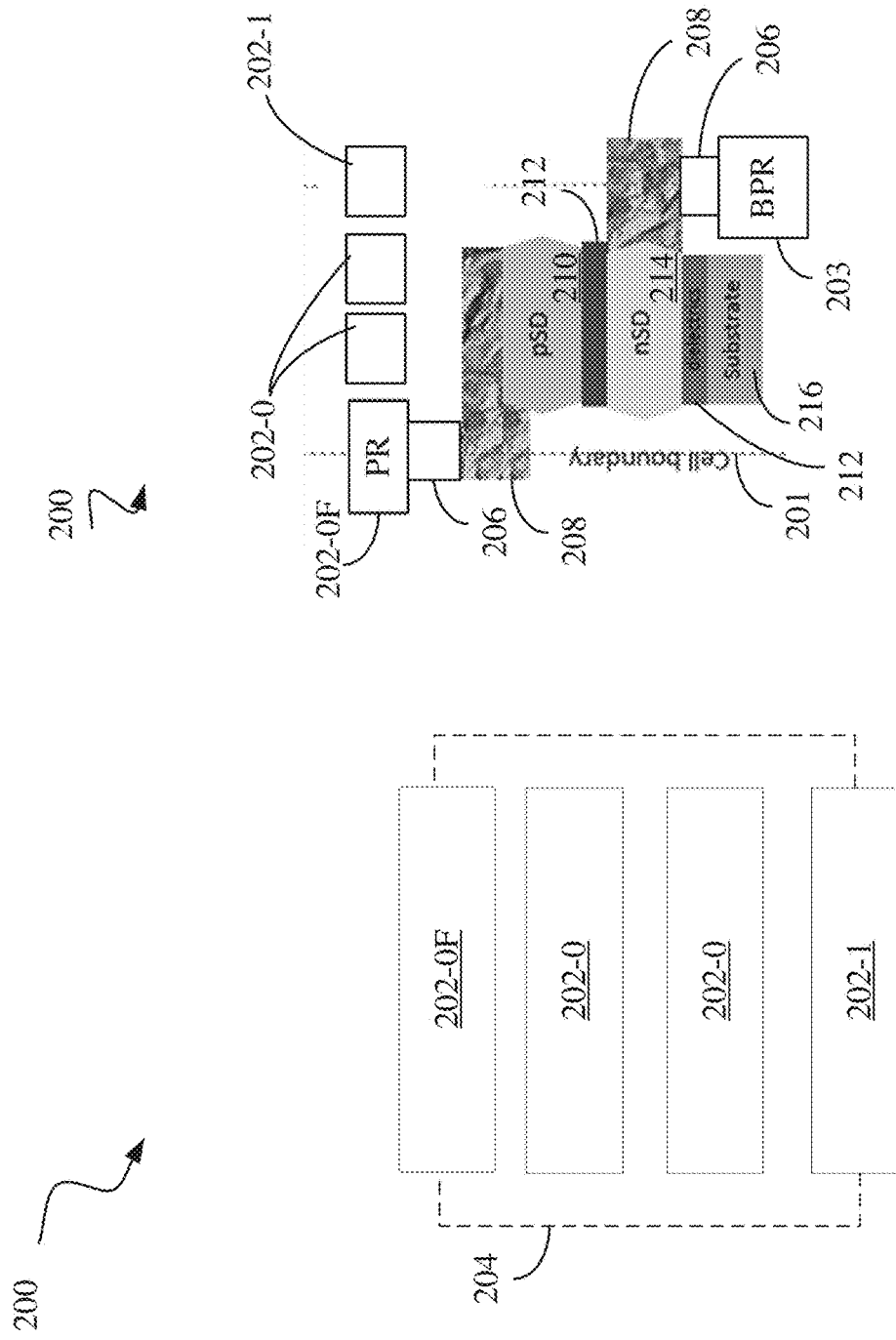
FIG. 2A is a block diagram of the top view of an example vertically-stacked FET CMOS device, in accordance with some embodiments of the present disclosure.
FIG. 2B is a block diagram of a cross-section view of an example vertically-stacked FET CMOS device, in accordance with some embodiments of the present disclosure.

FIG. 2A is a block diagram of the top view of an example vertically-stacked FET CMOS device 200 having a single row standard cell, in accordance with some embodiments of the present disclosure. The example vertically-stacked FET CMOS device 200 includes a single row standard cell 204, the boundaries of which are indicated by cell boundaries 201. Additionally, the example vertically-stacked FET CMOS device 200 includes tracks 202-0F, 202-0, 202-1 (collectively referred to herein as tracks 202). The standard cell 204 can represent one unit of storage and/or logic in the example vertically-stacked FET CMOS device 200. The tracks 202 occupy a standardized unit of space within the example vertically-stacked FET CMOS device 200, and provide electrically conductive paths for configuring the example vertically-stacked FET CMOS device 200. Further, the track 202-0F may include a power rail on the front side of the example vertically-stacked FET CMOS device 200 (e.g., the voltage drain [VDD]). Additionally, the tracks 202-0, 202-0F may be disposed above vertically-stacked FETs (not shown). More specifically, the vertically-stacked FETs may include a p-type and n-type FET (e.g., a PFET and NFET, respectively). The track 202-1 may represent a shared signal track. The signal track may be shared between the standard cell 204 and a neighboring standard cell (not shown).

FIG. 2B is a block diagram of a cross-section view of the example vertically-stacked FET CMOS device 200 having a single row standard cell, in accordance with some embodiments of the present disclosure. The example vertically-stacked FET CMOS device 200 includes track 202-0F (e.g., power rail [PR]), described with respect to FIG. 2A. Additionally, the example vertically-stacked FET CMOS device 200 includes buried power rail (BPR) 203 (e.g., the voltage source (VSS)). Additionally, the BPR 203 may be disposed on the backside of the example vertically-stacked FET CMOS device 200, beneath track 202-1 described with respect to FIG. 2A. With the VDD disposed on the front side (e.g., track 202-0F) and the VSS on the back side (e.g., BPR 203), the example vertically-stacked FET CMOS device 200 may represent a split power rail design. Advantageously, placing the VSS on the BPR 203 makes it possible to use the track 202-1 for shared signals, thus increasing the available signal tracks by 25% over existing CMOS devices.

Additionally, the example vertically-stacked FET CMOS device 200 can include contacts 206, vias 208, PFET (pSD) 210, dielectrics 212, NFET (nSD) 214, and substrate 216. The contact 206 on the front side (e.g., towards the top as shown in the cross-section view) of the example vertically-stacked FET CMOS device 200 may provide a path for electrical current from the via 208 to the track 202-0F (e.g., VDD) from the stacked FET, (e.g., PFET 210 and NFET 214). The PFET 210 and NFET 214 can be p-type and n-type FETS, respectively. The dielectrics 212 may be insulators, (e.g., substances that transmit electric force without conduction). The contact 206 and via 208 towards the bottom as shown in the cross-section view, may provide a path for electrical current from the VSS (e.g., BPR 203). The substrate 216 may be the underlying layer of the example vertically-stacked FET CMOS device 200, which may be composed of silicon.

FIG. 3A is a block diagram of the top view of an example vertically-stacked FET CMOS device 300 having double row standard cells, in accordance with some embodiments of the present disclosure. More specifically, the double row standard cells may refer to neighboring standard cells 304-1, 304-2, whose cell boundaries are indicated by the dotted lines. Additionally, the example vertically-stacked FET CMOS device 300 includes tracks 302-0F, 302-0, 302-1 (collectively referred to herein as tracks 302). The tracks 302 are similar to the tracks 202 described with respect to FIG. 2. Similar to track 202-0F, the tracks 302-0F may represent power rails (e.g., VDDs) on the front side of the example vertically-stacked FET CMOS device 300. Further, tracks 302-0, 302-1 may be similar to tracks 202-0, 202-1 described with respect to FIG. 2A. The track 302-1 may represent a shared signal track (e.g., shared between neighboring standard cells 304-1, 304-2).

Similar to the example vertically-stacked FET CMOS device 200, the example vertically-stacked FET CMOS device 300 can include a power rail (e.g., VSS) disposed on the backside, beneath track 302-1 on the BPR (not shown). Further, the example vertically-stacked FET CMOS device 300 may represent a split power rail design. In the example vertically-stacked FET CMOS device 300, the power staple can periodically connect from the power distribution network (PDN) to the BPR. In this way, some embodiments of the present disclosure can connect the power distribution network from the front side to the Buried Power Rail (BPR). Doing so periodically may reduce the effective connection resistance between the PDN and BPR FIG. 3B is a block diagram of a cross-section view of the example vertically-stacked FET CMOS device 300 having double row standard cells, in accordance with some embodiments of the present disclosure. The example vertically-stacked FET CMOS device 300 includes standard cells 304-1, 304-2 (collectively referred to as cells 304). Further, the example vertically-stacked FET CMOS device 300 includes tracks 302-0F (e.g., power rails [PR]), described with respect to FIG. 3A. Additionally, the example vertically-stacked FET CMOS device 300 includes tracks 302-0, 302-1. Further, the example vertically-stacked FET CMOS device 300 includes BPR 303. In some embodiments of the present disclosure, the BPR 303 may represent the voltage source (VSS). Additionally, the BPR 303 may be disposed on the backside of the example vertically-stacked FET CMOS device 300, beneath track 302-1 described with respect to FIG. 3A. Advantageously, placing the VSS on the BPR 303 makes it possible to use the track 302-1 for shared signals, thus increasing the available signal tracks by 35% over existing CMOS devices.

Additionally, the example vertically-stacked FET CMOS device 300 can include cell boundary 301, contacts 306, vias 308, PFET (pSD) 310, dielectrics 312, NFET (nSD) 314, and substrate 316, which may be respectively similar to the cell boundary 201, contacts 206, vias 208, PFET (pSD) 210, dielectrics 212, NFET (nSD) 214, and substrate 216, described with respect to FIG. 2B.

Advantageously, the double row standard cell can improve design efficiency of the example vertically-stacked FET CMOS device 300 by providing more access points than available in the single row cell. Further, the double-row standard cell can make it possible to more efficiently implement more complex cell layouts, such as the AND-OR-INVERT (AOI22) circuit. Additionally, with increased wiring efficiency, the split power rail can relax metal pitch for a fixed cell height.

Figures 4A, 4B:
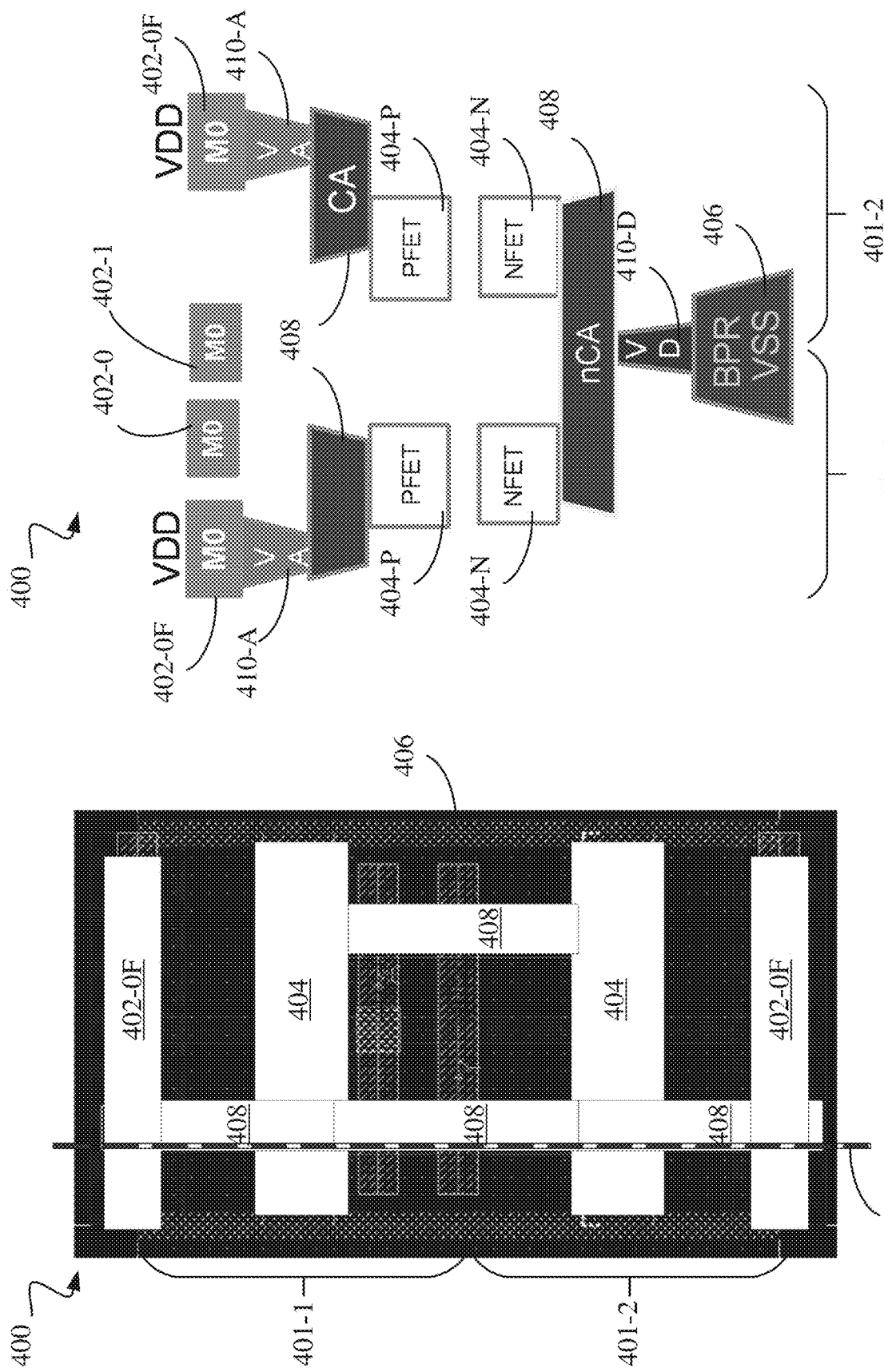
FIG. 4A is a block diagram of the top view of an example vertically-stacked FET CMOS device, in accordance with some embodiments of the present disclosure.
FIG. 4B is a block diagram of a cross-section view of an example vertically-stacked FET CMOS device, in accordance with some embodiments of the present disclosure.

FIG. 4A is a block diagram of the top view of an example vertically-stacked FET CMOS device 400 having double row standard cells, in accordance with some embodiments of the present disclosure. The example vertically-stacked FET CMOS device 400 includes standard cells 401-1, 401-2 (collectively referred to as cells 401), tracks 402, stacked FETS 404, BPR 406, contacts 408, and cut 409-A. The cells 401 are similar to the standard cells 304-1, 304-2 described with respect to FIGS. 3A, 3B. The tracks 402 are similar to the tracks 202 described with respect to FIGS. 2A, 2B. The stacked FETS 404 can include a PFET and NFET, disposed vertically with respect to each other. According to some embodiments of the present disclosure, the PFET may be disposed above the NFET, or the NFET may be disposed above the PFET. The BPR 406 may be similar to the BPR 303. The contacts 408, in electrical contact with the VDD or the VSS, and with vias (not shown), may provide a path for electric current from the BPR 406 (e.g., VSS) to the tracks 402-0F (e.g., VDD) through the stacked FETS 404 (e.g., PFETS 404-P and NFETS 404-N). Additionally, the cut 409-A represents a location of a cut into the example vertically-stacked FET CMOS device 400 where a cross-section view is viewable, as described with respect to FIG. 4B.

FIG. 4B is a block diagram of a cross-section view of the example vertically-stacked FET CMOS device 400 having a double row standard cell, in accordance with some embodiments of the present disclosure. The example vertically-stacked FET CMOS device 400 includes standard cells 401-1, 401-2 tracks 402-0F, 402-0, BPR 406, and contacts 408, described with respect to FIG. 4A. It is noted that the tracks 402 are annotated with, "MO," which indicates an MO interconnect. The MO interconnect may be similar to the tracks 202 and 302 described with respect to FIGS. 2A, 2B, 3A, and 3B.

Referring back to FIG. 4B, the example vertically-stacked FET CMOS device 400 can include PFETS 404-P, NFETS 404-N, and vias 410-A, 410-D (collectively referred to as vias 410). Each cell 401 can include one stacked FET 404, having one PFET 404-P stacked over one NFET 404-N. However, according to some embodiments of the present disclosure, the NFET 404-N is stacked over the PFET 404-P. The vias 410 can be electrical pathway passing between layers of CMOS devices. In this example, the via 410-D provides an electrical pathway from the layer having the BPR 406 to the layer having contact 408 (e.g., nCA). Additionally, the via 410-A provides an electrical pathway from the layer having the contact 408 (e.g., CA) to the layer having the tracks 402-0F. While this example shows VA and VD vias, and CA and nCA contacts, the types and dispositions of vias and contacts may vary.

FIG. 4C is a block diagram of the top view of the example vertically-stacked FET CMOS device 400 having double row standard cells, in accordance with some embodiments of the present disclosure. The example vertically-stacked FET CMOS device 400 includes standard cells 401-1, 401-2 (collectively referred to as cells 401), tracks 402, stacked FETS 404, BPR 406, contacts 408, and cut 409-C. The cells 401, tracks 402, stacked FETS 404, BPR 406, contacts 408 can be similar to the cells 401, tracks 402, stacked FETS 404, BPR 406, and contacts 408, described with respect to FIGS. 4A, 4B. Additionally, the cut 409-C represents a location of a cut into the example vertically-stacked FET CMOS device 400 where a cross-section view is viewable, as described with respect to FIG. 4D.

FIG. 4D is a block diagram of a cross-section view of the example vertically-stacked FET CMOS device 400 having a double row standard cell, in accordance with some embodiments of the present disclosure. The example vertically-stacked FET CMOS device 400 includes standard cells 401-1, 401-2 tracks 402-0F, 402-0, 402-1, PFETS 404-P, NFETS 404-N, BPR 406, and contacts 408, described with respect to FIG. 4C.

Referring back to FIG. 4D, the example vertically-stacked FET CMOS device 400 can include vias 410-A, 410-C (e.g., VA and VC). In this example, the via 410-A provides an electrical pathway from the layer having contact 408 (e.g., CA) to the layer having track 402-1. Additionally, the via 410-C provides electrical contact between the contacts 408 (e.g., CA and nCA), and the PFETS 404-P and NFETS 404-N. In this example, via 410-C connects to the source/drain (S/D) of the PFETS 404-P and the S/D of the NFETS 404-N. Additionally, the via 410-C connects to track 402-1 for output thru contact 408 (e.g., CA) and the via 410-A. In this example, the FIG. 4D can represent an output node of the circuit (e.g., inverter) represented by the example vertically-stacked FET CMOS device 400. Further, the output node does not have a direct connection to a power rail. Conceptually, a separate VC can be used to connect each stacked FET 404, but for this circuit, the stacked FETS 404 are electrically connected, so the two separate VC's are merged into one via (e.g., via 410-C). While this example shows VA and VC vias, and CA and nCA contacts, the types and dispositions of the vias and contacts may vary. According to some embodiments of the present disclosure, the vertically-stacked FET CMOS device 400 can be useful for a double row inverse circuit (e.g., INV_X2), a double row not AND circuit (e.g., NAND2_X1), and an AND or inverse circuit, (e.g., AOI22_X1).

Figures 5A, 5B:
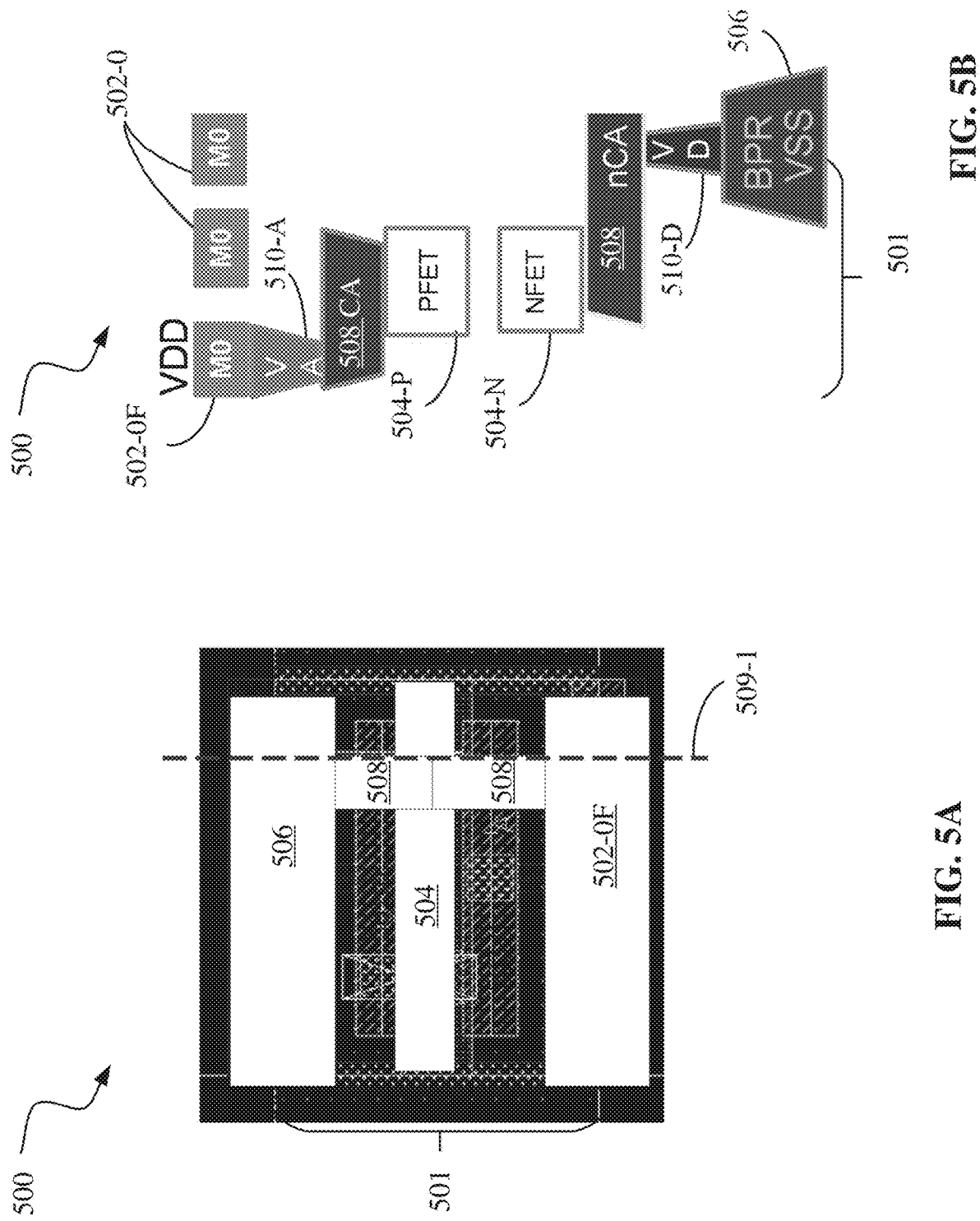
FIG. 5A is a block diagram of the top view of an example vertically-stacked FET CMOS device, in accordance with some embodiments of the present disclosure.
FIG. 5B is a block diagram of a cross-section view of an example vertically-stacked FET CMOS device, in accordance with some embodiments of the present disclosure.

FIG. 5A is a block diagram of the top view of an example vertically-stacked FET CMOS device 500 having a single row standard cell, in accordance with some embodiments of the present disclosure. The example vertically-stacked FET CMOS device 500 includes standard cell 501, tracks 502-0F, 502-0, (collectively referred to as tracks 502), stacked FETS 504, BPR 506, contacts 508, and cut 509-1. The cell 501 can be similar to the standard cell 204, described with respect to FIG. 2A. Additionally, the tracks 502, stacked FETS 504, BPR 506, and contacts 508 can be similar to the tracks 402, stacked FETS 404, BPR 406, and contacts 408, described with respect to FIGS. 4A, 4B. Further, the cut 509-1 represents a location of a cut into the example vertically-stacked FET CMOS device 500 where a cross-section view is viewable, as described with respect to FIG. 5B.

FIG. 5B is a block diagram of a cross-section view of the example vertically-stacked FET CMOS device 500 having the single row standard cell 501, in accordance with some embodiments of the present disclosure. The example vertically-stacked FET CMOS device 500 includes the standard cell 501, tracks 502-0F, 502-0 (collectively referred to as tracks 502), PFETS 504-P, NFETS 504-N, BPR 506, and contacts 508, described with respect to FIG. 5A.

Referring back to FIG. 5B, the example vertically-stacked FET CMOS device 500 can also include vias 510-A, 510-C (e.g., VA, VC). In this example, the via 510-D (e.g., VD) provides an electrical pathway from the BPR 506 to the contact 508 (e.g., nCA). Additionally, the contact 508 provides an electrical pathway from the via 510-D to the NFET 504-N. The NFET 504-N is electrically isolated from the PFET 504-P. Accordingly, the via 510-A (e.g., VA) provides electrical contact from the contact 508 (e.g., CA) to the layer having track 502-0F. While this example shows VA, and VD vias, and CA and nCA contacts, the types and dispositions of the vias and contacts may vary.

According to some embodiments of the present disclosure, the example vertically-stacked FET CMOS device 500 includes the PFET 504-P stacked vertically above the NFET 504-N. Further, a VDD supply conducting material (e.g., 502-0F) is vertically above the PFET 504-P, and the VSS supply conducting material (e.g., BPR 506) is vertically below the NFET 504-N. Additionally, one or more signal metal (e.g., tracks 502-0) are vertically above the PFET 504-P. While this example includes the PFET 504-P above the NFET 504-N, in some embodiments of the present disclosure, the NFET 504-N is vertically above the PFET 504-P. Further, the transistor source (e.g., contact nCA, via VC) or drain (e.g., contact CA, via VC) is extended from the transistor (e.g., PFET 504-P, NFET 504-N) to connect to another transistor S/D (e.g., NFET 504-N, PFET 504-P) and to the VDD (e.g., 502-0F) or VSS (e.g., BPR 506) power rail. Further, according to some embodiments of the present disclosure, the example vertically-stacked FET CMOS device 500 can be useful for a single finger inverse circuit (e.g., INV_X1).

FIG. 5C is a block diagram of the top view of the example vertically-stacked FET CMOS device 500 having a single row standard cell, in accordance with some embodiments of the present disclosure. The example vertically-stacked FET CMOS device 500 includes standard cell 501, tracks 502-0F, 502-0, stacked FETS 504, BPR 506, and contacts 508, described with respect to FIG. 5A. Additionally, the example vertically-stacked FET CMOS device 500 includes cut 509-2, which represents a location of a cut into the example vertically-stacked FET CMOS device 500 where a cross-section view is viewable, as described with respect to FIG. 5D.

FIG. 5D is a block diagram of a cross-section view of the example vertically-stacked FET CMOS device 500 having the single row standard cell 501, in accordance with some embodiments of the present disclosure. The example vertically-stacked FET CMOS device 500 includes PFETS 504-P (e.g., S/D), NFETS 504-N (e.g., S/D), and contacts 508, described with respect to FIG. 5C. Additionally, the example vertically-stacked FET CMOS device 500 includes via 510-C, which is similar to via 410-C, described with respect to FIG. 4B. Further, the example vertically-stacked FET CMOS device 500 includes gates 512. The gates 512 can consist of FETS and control the flow of electric current through a circuit.

Figure 5F:
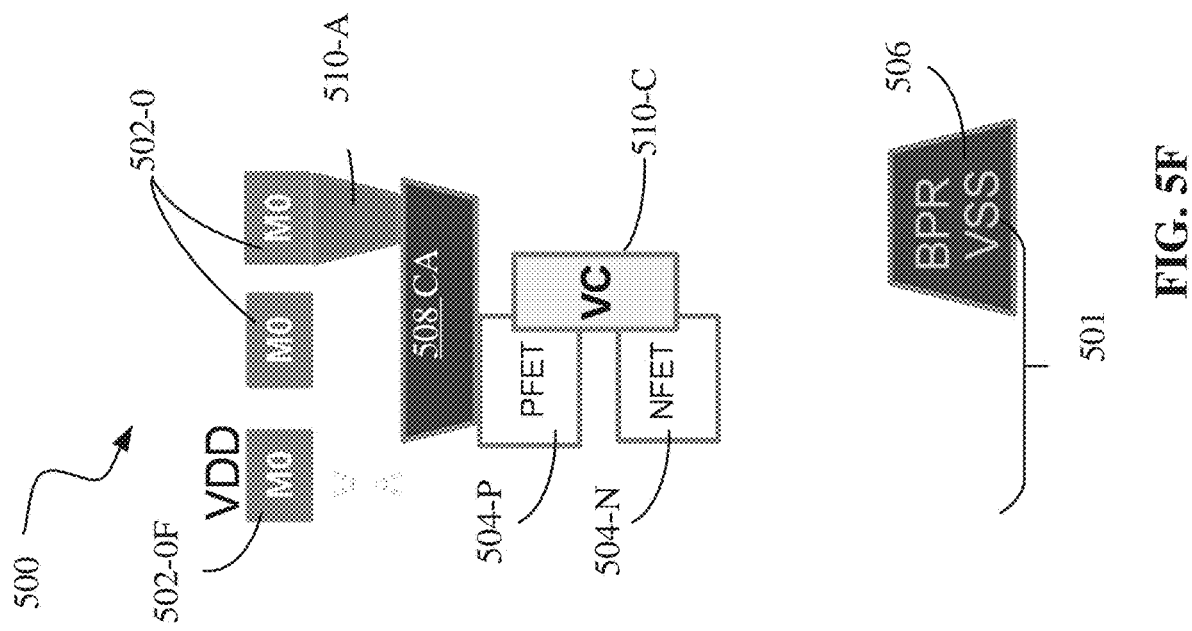
FIG. 5F is a block diagram of a cross-section view of an example vertically-stacked FET CMOS device, in accordance with some embodiments of the present disclosure.
Figure 5E:
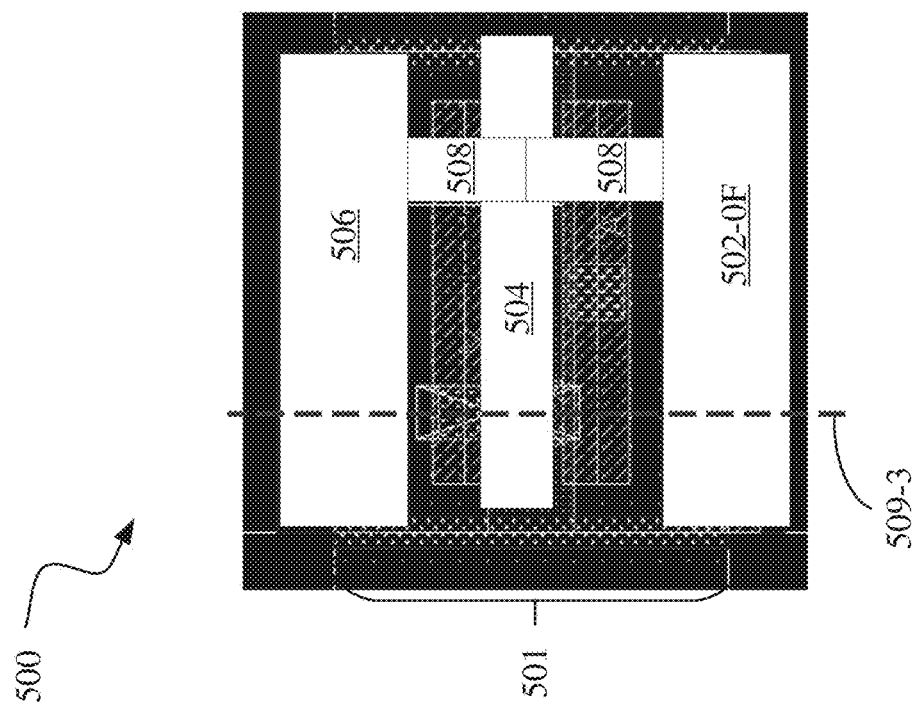
FIG. 5E is a block diagram of the top view of an example vertically-stacked FET CMOS device, in accordance with some embodiments of the present disclosure.

FIG. 5E is a block diagram of the top view of the example vertically-stacked FET CMOS device 500 having a single row standard cell, in accordance with some embodiments of the present disclosure. The example vertically-stacked FET CMOS device 500 includes standard cell 501, tracks 502-0F, 502-0, stacked FETS 504, BPR 506, and contacts 508, described with respect to FIG. 5A. Additionally, the example vertically-stacked FET CMOS device 500 includes cut 509-3, which represents a location of a cut into the example vertically-stacked FET CMOS device 500 where a cross-section view is viewable, as described with respect to FIG. 5F.

FIG. 5F is a block diagram of a cross-section view of the example vertically-stacked FET CMOS device 500 having the single row standard cell 501, in accordance with some embodiments of the present disclosure. The example vertically-stacked FET CMOS device 500 includes the standard cell 501, tracks 502-0F, 502-0, PFET 504-P, NFET 504-N, BPR 506, contact 508, described with respect to FIG. 5E. Additionally, the example vertically-stacked FET CMOS device 500 includes via 510-C, described with respect to FIG. 5D.

Referring back to FIG. 5F, the via 510-C (e.g., VC) provides an electrical pathway from the NFET 504-N to the PFET 504-P. Additionally, the via 510-A (e.g., VA) provides electrical contact from the contact 508 (e.g., CA) to the layer having track 502-0. While this example shows a VC via, and CA contact, the types and dispositions of the via and contact may vary. In this example, the FIG. 5F can represent an output node of the circuit (e.g., inverter) represented by the example vertically-stacked FET CMOS device 500.

Figure 6B:
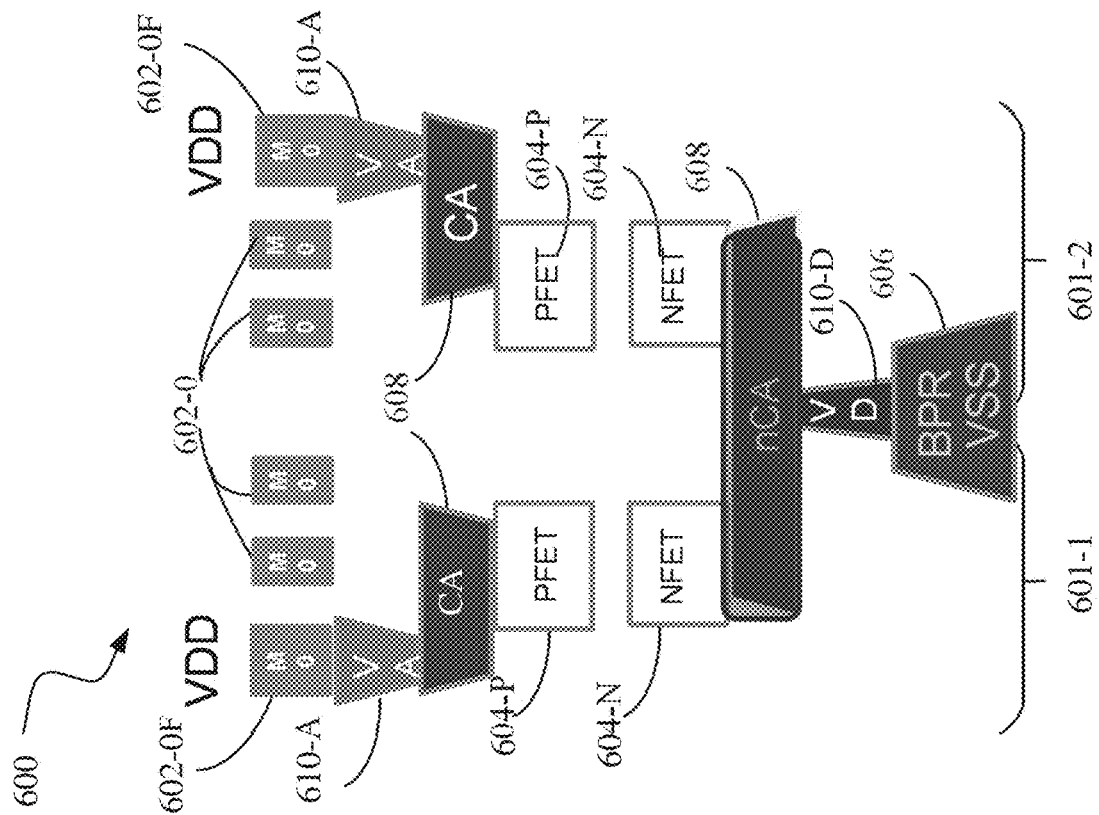
FIG. 6B is a block diagram of a cross-section view of an example vertically-stacked FET CMOS device, in accordance with some embodiments of the present disclosure.
Figure 6A:
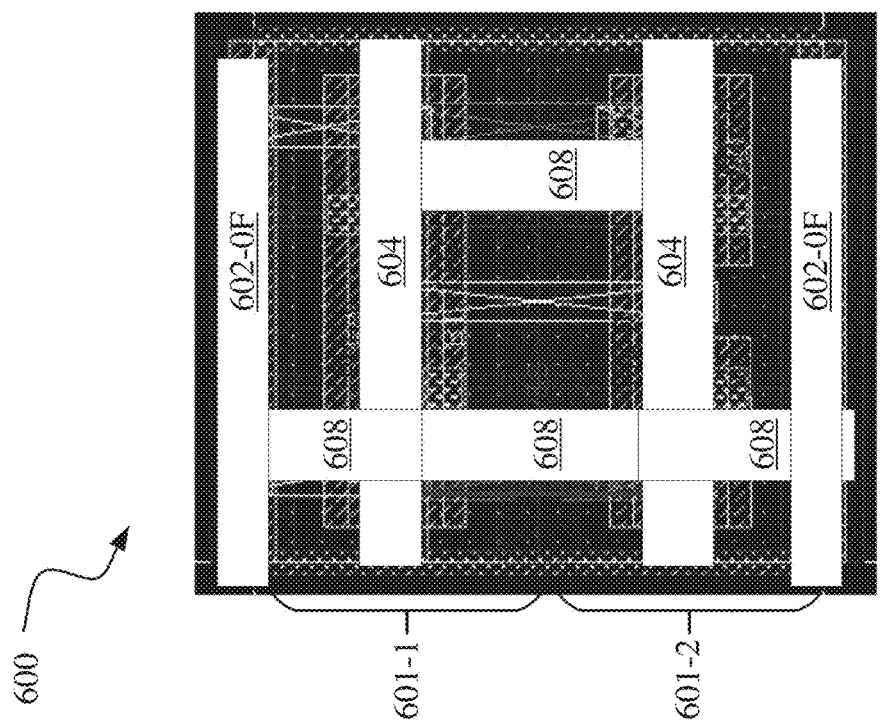
FIG. 6A is a block diagram of the top view of an example vertically-stacked FET CMOS device, in accordance with some embodiments of the present disclosure.

FIG. 6A is a block diagram of the top view of an example vertically-stacked FET CMOS device 600 having a double row standard cell, in accordance with some embodiments of the present disclosure. The example vertically-stacked FET CMOS device 600 includes standard cells 601-1, 601-2 (collectively referred to as standard cells 601), tracks 602-0F, 602-0 (collectively referred to as tracks 602), stacked FETS 604, BPR 606, and contacts 608. The cell 601 can be similar to the standard cell 304, described with respect to FIG. 3A. Additionally, the tracks 602, stacked FETS 604, BPR 606, and contacts 608 can be similar to the tracks 402, stacked FETS 404, BPR 406, and contacts 408, described with respect to FIGS. 4A, 4B.

FIG. 6B is a block diagram of a cross-section view of the example vertically-stacked FET CMOS device 600 having the double row standard cells 601-1, 601-2, in accordance with some embodiments of the present disclosure. The example vertically-stacked FET CMOS device 600 includes the standard cells 601-1, 601-2, tracks 602-0F, 602-0, PFETS 604-P, NFETS 604-N, BPR 606, and contacts 608, described with respect to FIG. 6A.

Referring back to FIG. 6B, the example vertically-stacked FET CMOS device 600 can also include vias 610-A, 610-D (e.g., VA and VD), respectively. In this example, the via 610-D (e.g., VD) provides an electrical pathway from the BPR 606 to the contact 608 (e.g., nCA). In this example, the NFET 604-P is electrically isolated from the PFET 604-N. Accordingly, the vias 610-A (e.g., VA on left and right) provide electrical contact from the contacts 608 (e.g., CA) to the layer having tracks 602-0F. While this example shows VA and VD vias, and CA and nCA contacts, the types and dispositions of the vias and contacts may vary.

In the example vertically-stacked FET CMOS device 600, the architecture of standard cell 601-1 is mirrored along the VSS power rail axis (e.g., BPR 806), forming a double row cell with VDD (e.g., 602-0F) on the north side and south side of the cell boundaries and zero or one signal wires (e.g., tracks 602) shared between the two abutting cells (e.g., standard cells 601-1, 601-2).

Figure 7B:
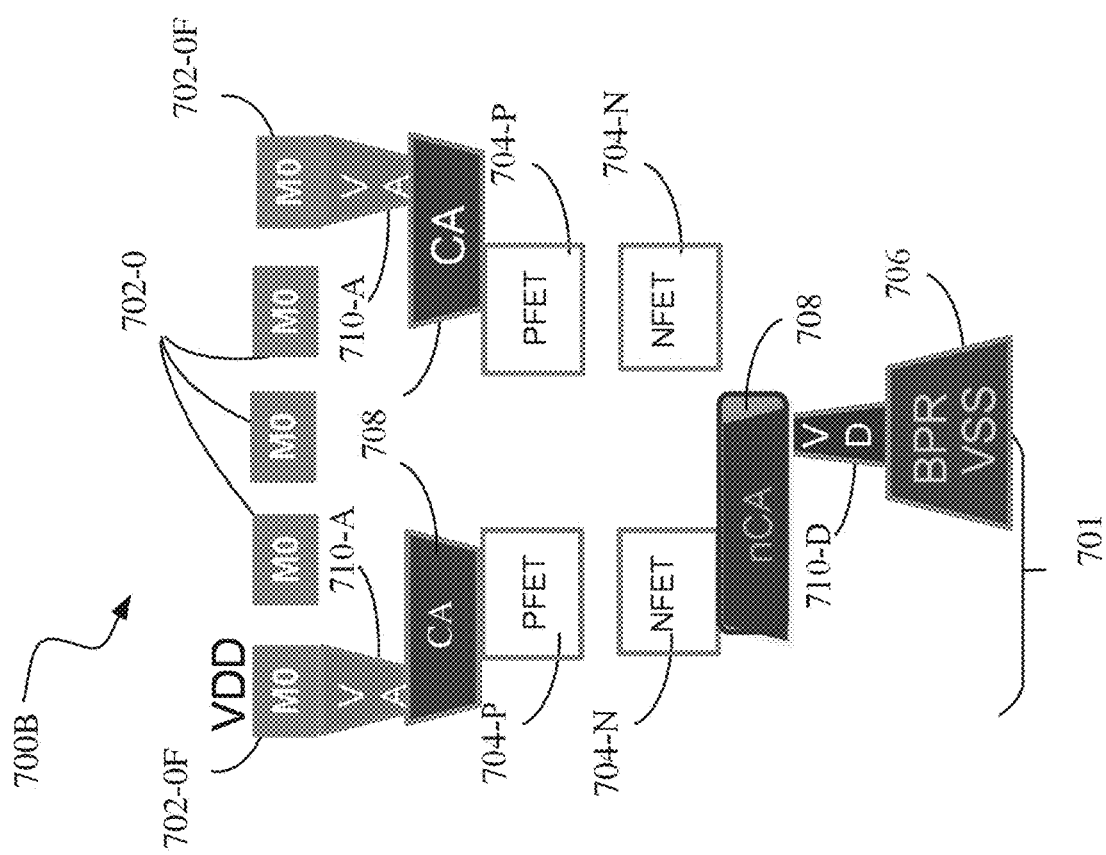
FIG. 7B is a block diagram of a cross-section view of an example vertically-stacked FET CMOS device, in accordance with some embodiments of the present disclosure.
Figure 7A:
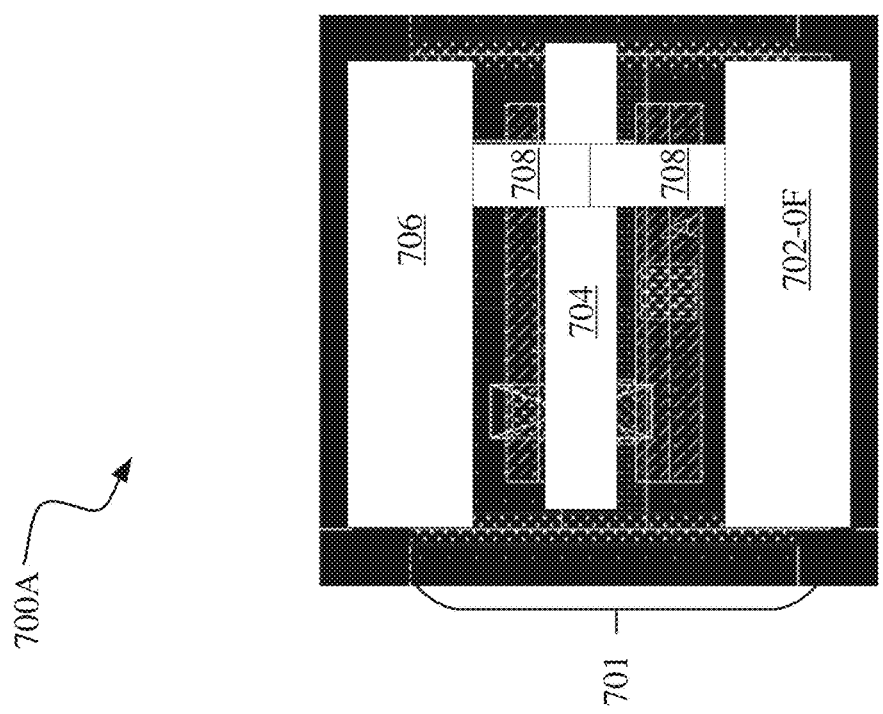
FIG. 7A is a block diagram of the top view of an example vertically-stacked FET CMOS device, in accordance with some embodiments of the present disclosure.

FIG. 7A is a block diagram of the top view of an example vertically-stacked FET CMOS device 700A having a single row standard cell, in accordance with some embodiments of the present disclosure. The example vertically-stacked FET CMOS device 700A includes standard cell 701, tracks 702-0F, 702-0, stacked FET 704, BPR 706, and contacts 708. The cell 701 can be similar to the standard cell 204, described with respect to FIG. 2A. Additionally, the tracks 702, stacked FET 704, BPR 706, and contacts 708 can be respectively similar to the tracks 402, stacked FETS 404, BPR 406, and contacts 408, described with respect to FIGS. 4A, 4B.

FIG. 7B is a block diagram of a cross-section view of the example vertically-stacked FET CMOS device 700B having the single row standard cell 701, in accordance with some embodiments of the present disclosure. The example vertically-stacked FET CMOS device 700B includes the standard cell 701, tracks 702-0F, 702-0, PFETS 704-P, NFETS 704-N, BPR 706, and contacts 708, described with respect to FIG. 7A.

Referring back to FIG. 7B, the example vertically-stacked FET CMOS device 700B can include vias 710-A, 710-D (e.g., VA and VD, respectively). In this example, the via 710-D (e.g., VD) provides an electrical pathway from the BPR 706 to the contact 708 (e.g., nCA). Additionally, NFET 704-P is electrically isolated from the PFET 704-N. Accordingly, the vias 710-A (e.g., VA) provide electrical contact from the contact 708 (e.g., CA) to the layer having tracks 702-0F. While this example shows VA and VD vias, and CA and nCA contacts, the types and dispositions of the vias and contacts may vary.

Further, in the example vertically-stacked FET CMOS device 700B, the transistor source (e.g., contact nCA) or drain (e.g., contact CA) is extended from the transistor (e.g., PFET 7004-P, NFET 704-N) to connect to the VDD (e.g., 702-0F) or VSS power rail (BPR 706). However, the VSS is connected to the NFET 704-N on the left side (not the right side) of the example vertically-stacked FET CMOS device 700B. Thus, the stacked FET 704 on the right side, is not functional. The right side of FIG. 7B (e.g., cell 701-2) can be a circuit of a different logic function from cell 701-1, and might not have a connection to VSS.

Figure 8:
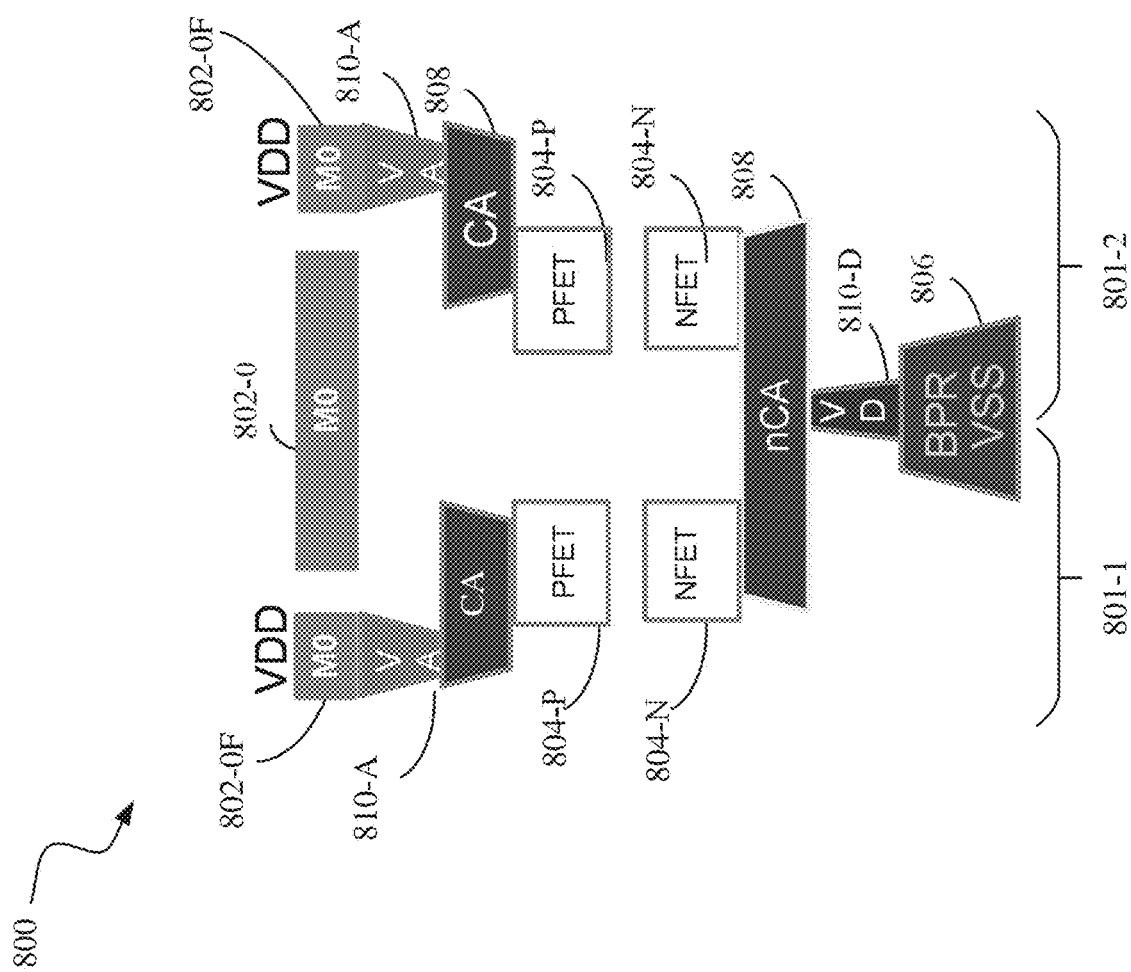
FIG. 8 is a block diagram of a cross-section view of an example vertically-stacked FET CMOS device, in accordance with some embodiments of the present disclosure.

FIG. 8 is a block diagram of a cross-section view of the example vertically-stacked FET CMOS device 800 having the double row standard cells 801-1, 801-2, in accordance with some embodiments of the present disclosure. The example vertically-stacked FET CMOS device 800 includes standard cells 801-1, 801-2, tracks 802-0F, 802-0, PFETS 804-P, NFETS 804-N, BPR 806, contacts 808, and vias 810, which may be respectively similar to the standard cells 601-1, 601-2, tracks 602-0F, PFETS 604-P, NFETS 604-N, BPR 606, contacts 608, and vias 610, described with respect to FIGS. 6A, 6B. Further, the track 802-0 can be similar to the track 602-0, described with respect to FIGS. 6A, 6B. However, the disposition of tracks 602-0 and track 802-0 may vary. Specifically, the tracks 602-0 may be disposed in parallel with respect to the tracks 602-0F. In contrast, the track 802-0 may be disposed orthogonally with respect to the tracks 802-0F. Accordingly, the track 802-0 may mirror across the center line (e.g., the standard cell border). In this way, the track 802-0 can perform signal connections across the mirroring centerline.

The example vertically-stacked FET CMOS device 800 can include vias 810 (e.g., VA and VD). In this example, the via 810 (e.g., VD) provides an electrical pathway from the BPR 806 to the contact 808 (e.g., nCA). Additionally, the NFETS 804-P may be electrically isolated from the PFETS 804-N. Accordingly, the vias 810-A can provide electrical contact from the contacts 808 (e.g., CA) to the layer having tracks 802-0F. While this example shows VA and VD vias, and CA and nCA contacts, the types and dispositions of the vias and contacts may vary.

Figure 9A:
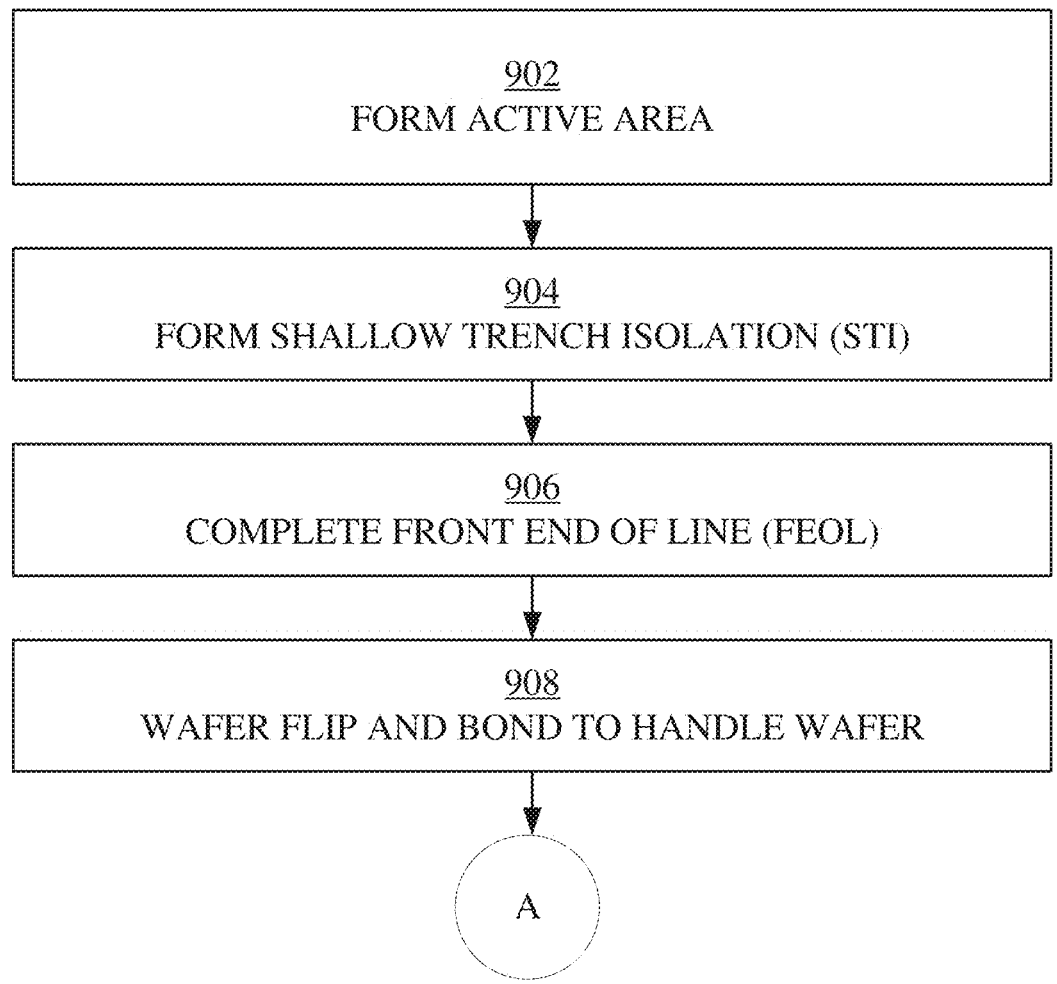
FIGS. 9A and 9B are process flow charts of a method for fabricating vertically-stacked FET CMOS devices, in accordance with some embodiments of the present disclosure.

FIG. 9A is a process flow chart of a portion of method 900 for fabricating vertically-stacked FET CMOS devices, in accordance with some embodiments of the present disclosure. In some embodiments, an example vertically-stacked FET CMOS fabrication manager, such as the example vertically-stacked FET CMOS fabrication manager 100 described with respect to FIG. 1, can perform the method 900.

At operation 902, the example vertically-stacked FET CMOS fabrication manager 100 can form an active area. Forming an active area can involve vertically isolating an area of the wafer using oxide that is pre-formed at the wafer level.

At operation 904, the example vertically-stacked FET CMOS fabrication manager 100 can form the shallow trench isolation (STI). Additionally, the example vertically-stacked FET CMOS fabrication manager 100 can reveal the STI to expose the top device. The top device can be the top FET of a stacked FET, such as a PFET 1104-P.

At operation 906, the example vertically-stacked FET CMOS fabrication manager 100 can complete the front end of line (FEOL). Completing the FEOL can involve forming the dummy gate, spacer, epitaxy source/drain (S/D), dielectric fill, gate dielectrics and metal gate, protection layer, and sacrificial material. Additionally, completing the FEOL can involve performing dummy gate removal.

At operation 908, the example vertically-stacked FET CMOS fabrication manager 100 can perform a wafer flip and bond. Performing the wafer flip and bond may make it possible for the example vertically-stacked FET CMOS fabrication manager 100 to handle the wafer. In this example, control flows to the placeholder, "A," which continues the method in FIG. 9B.

Figure 9B:
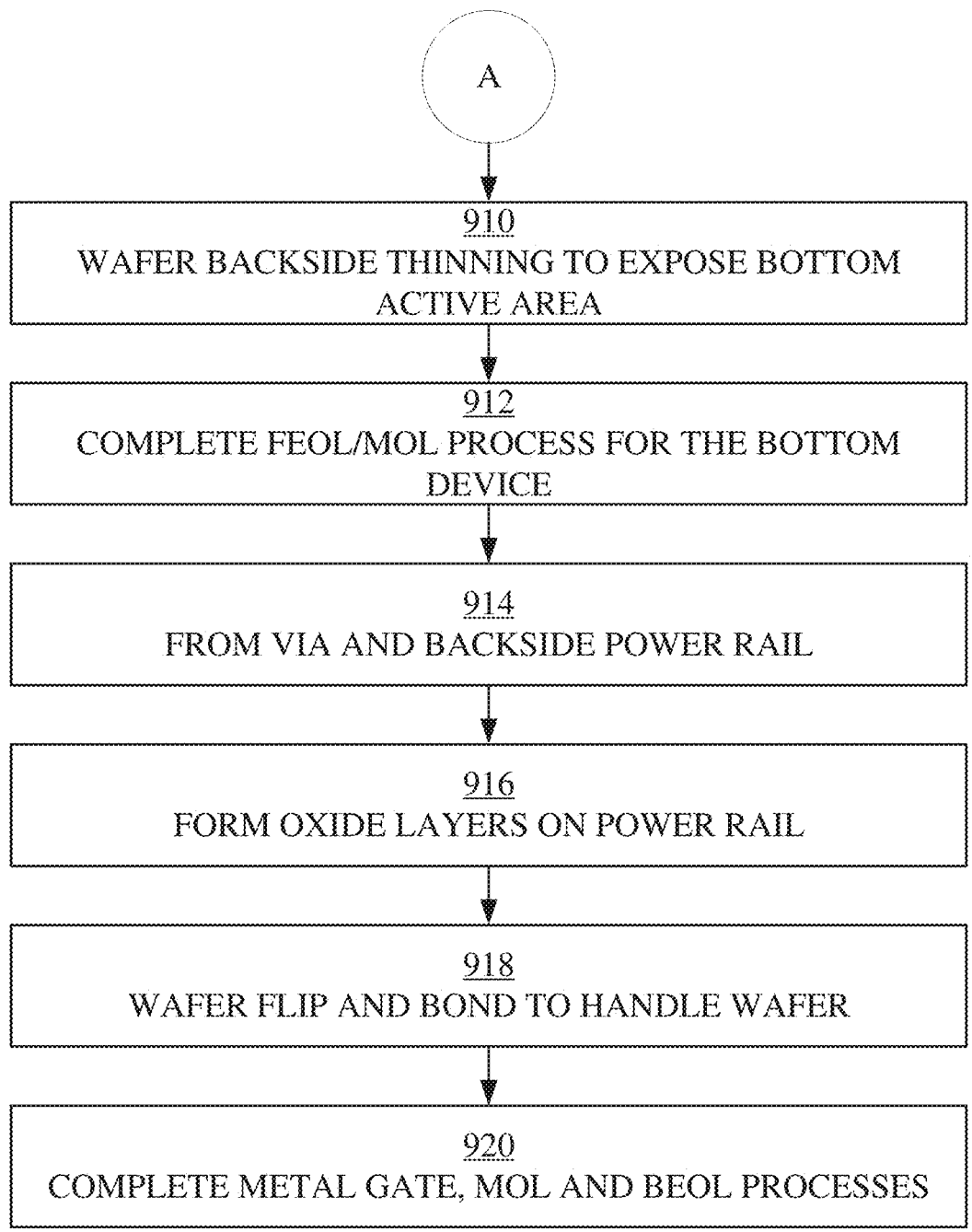

FIG. 9B is a process flow chart of a portion of method 900 for fabricating vertically-stacked FET CMOS devices, in accordance with some embodiments of the present disclosure. In this example, control flows from the placeholder, "A," to operation 910.

At operation 910, the example vertically-stacked FET CMOS fabrication manager 100 can perform wafer backside thinning. Performing wafer backside thinning can expose the bottom active areas.

At operation 912, the example vertically-stacked FET CMOS fabrication manager 100 can complete the FEOL and/or middle of line (MOL) process for the bottom device. Completing the FEOL and/or MOL process can involve generating the bottom FET of a stacked FET, such as stacked FET 404.

At operation 914, the example vertically-stacked FET CMOS fabrication manager 100 can form the via and backside power rail. Forming the via and BPR, can enable the VSS for the vertically-stacked FET CMOS device being fabricated.

At operation 916, the example vertically-stacked FET CMOS fabrication manager 100 can form oxide layers on power rail. Forming oxide layers on the power rail can involve depositing oxide on the BPR.

At operation 918, the example vertically-stacked FET CMOS fabrication manager 100 can perform a wafer flip and bond. Performing the wafer flip and bond may make it possible for the example vertically-stacked FET CMOS fabrication manager 100 to handle the wafer.

At operation 920, the example vertically-stacked FET CMOS fabrication manager 100 can complete the metal gate, MOL process, and back end of line (BEOL) process. Completing the metal gate can involve forming the contacts to the stacked FET. Additionally, the MOL process can involve forming contacts (e.g., contacts 206, 306, and the like) to a source, drain, or gate. Further, the BEOL process can involve forming the metal wiring.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A semiconductor structure comprising:
   a top transistor device stacked on a bottom transistor device;
   a via in direct contact with a source drain of the top transistor device and a source drain of the bottom transistor device; and
   a top contact directly contacting the source drain of the top transistor device.

2. The semiconductor structure of claim 1, further comprising:
   a front side power rail electrically insulated from the top transistor device.

3. The semiconductor structure of claim 1, further comprising:
   a front side power rail above the top transistor device and laterally offset from a back side power rail, wherein the front side power rail is electrically insulated from the top transistor device.

4. The semiconductor structure of claim 1, further comprising:
   a back side power rail electrically insulated from the bottom transistor device.

5. The semiconductor structure of claim 1, further comprising:
   a front side power rail above the top transistor device and laterally offset from a back side power rail, wherein the front side power rail is electrically insulated from the top transistor device; and
   a back side power rail electrically insulated from the bottom transistor device.

6. The semiconductor structure of claim 1, further comprising:
   a front side power rail electrically insulated from the top transistor device; and a back side power rail laterally offset from the front side power rail.

7. The semiconductor structure of claim 1, further comprising:
a plurality of signal tracks arranged on a front side of the semiconductor structure, wherein the top contact is electrically connected to a single signal track of the plurality of signal tracks, and wherein the single signal track is vertically aligned with a back side power rail.

8. A semiconductor structure comprising:
a first stacked transistor structure adjacent to a second stacked transistor structure, wherein the first stacked transistor structure comprises a first top transistor device stacked above a first bottom transistor device, and wherein the second stacked transistor structure comprises a second top transistor device stacked above a second bottom transistor device;
a first top contact directly contacting the first top transistor device;
a second top contact directly contacting the second top transistor device; and
a single shared bottom contact directly contacting both the first bottom transistor device and the second bottom transistor device.

9. The semiconductor structure of claim 8, further comprising:
a first front side power rail in electrical contact with the first top contact; and
a second front side power rail in electrical contact with the second top contact.

10. The semiconductor structure of claim 8, further comprising:
a back side power rail laterally offset from a front side power rail.

11. The semiconductor structure of claim 8, further comprising:
a first front side power rail in electrical contact with the first top contact;
a second front side power rail in electrical contact with the second top contact; and
a back side power rail laterally offset from the first front side power rail.

12. The semiconductor structure of claim 8, further comprising:
a plurality of signal tracks arranged on a front side of the semiconductor structure, wherein the plurality of signal tracks are electrically insulated from both the first stacked transistor structure and the second stacked transistor structure.

13. A semiconductor structure comprising:
a first stacked transistor structure adjacent to a second stacked transistor structure, wherein the first stacked transistor structure comprises a first top transistor device stacked above a first bottom transistor device, and wherein the second stacked transistor structure comprises a second top transistor device stacked above a second bottom transistor device;
a single top shared contact directly contacting both the first top transistor device and the second top transistor device;
a single bottom shared contact directly contacting both the first bottom transistor device and the second bottom transistor device; and
a via directly contacting both the single top shared contact and the single bottom shared contact.

14. The semiconductor structure of claim 13, further comprising:
a first front side power rail electrically insulated from the first top transistor device; and
a second front side power rail electrically insulated from the second top transistor device.

15. The semiconductor structure of claim 13, further comprising:
a first front side power rail above the first stacked transistor structure and laterally offset from a back side power rail, wherein the first front side power rail is electrically insulated from the first top transistor device; and
a second front side power rail above the second stacked transistor structure and laterally offset from a back side power rail, wherein the second front side power rail is electrically insulated from the second top transistor device.

16. The semiconductor structure of claim 13, further comprising:
a back side power rail below and vertically aligned with the via.

17. The semiconductor structure of claim 13, further comprising:
a back side power rail below and vertically aligned with the via;
a first front side power rail above the first stacked transistor structure and laterally offset from the back side power rail; and
a second front side power rail above the second stacked transistor structure and laterally offset from the back side power rail.

18. The semiconductor structure of claim 13, further comprising:
a plurality of signal tracks arranged on a front side of the semiconductor structure, wherein the single top shared contact is electrically connected to a single signal track of the plurality of signal tracks, and wherein the single signal track is vertically aligned with the via.

* * * * *